(12) United States Patent
Kim (10) Patent No.: US 9,534,960 B2
(45) Date of Patent: Jan. 3, 2017

(54) METHOD FOR MEASURING TEMPERATURE USING A THERMISTOR

(76) Inventor: Jeong Soo Kim, Chungcheongnam-do (KR)

( * ) Notice: Subject to any disclaimer, the term of this patent is extended or adjusted under 35 U.S.C. 154(b) by 395 days.

(21) Appl. No.: 14/117,758

(22) PCT Filed: May 15, 2012

(86) PCT No.: PCT/KR2012/003790
§ 371 (c)(1),
(2), (4) Date: Nov. 14, 2013

(87) PCT Pub. No.: WO2012/157937
PCT Pub. Date: Nov. 22, 2012

(65) Prior Publication Data
US 2014/0079094 A1    Mar. 20, 2014

(30) Foreign Application Priority Data
May 19, 2011 (KR) .................. 10-2011-0047213

(51) Int. Cl.
| G01K 7/00 | (2006.01) |
| G01K 7/22 | (2006.01) |
| G01K 1/14 | (2006.01) |
| G01K 1/16 | (2006.01) |

(52) U.S. Cl.
CPC . *G01K 7/22* (2013.01); *G01K 1/14* (2013.01); *G01K 1/16* (2013.01)

(58) Field of Classification Search
CPC ....................................... G01K 7/02
USPC ....................................... 374/183
See application file for complete search history.

(56) References Cited

U.S. PATENT DOCUMENTS

| 3,949,609 A | * | 4/1976 | Hammerslag | ............ G01K 7/22 338/28 |
| 5,212,699 A | * | 5/1993 | Masuko | ............... G02B 6/4208 257/678 |
| 2003/0147449 A1 | * | 8/2003 | Chavan | ..................... G01J 5/14 374/137 |

FOREIGN PATENT DOCUMENTS

| JP | 05224100 A | 9/1993 |
| JP | 2006324524 A | 11/2006 |
| JP | 05224100 A | 4/2009 |
| JP | 2009293986 A | 12/2009 |

* cited by examiner

*Primary Examiner* — Lisa Caputo
*Assistant Examiner* — Nasir U Ahmed
(74) *Attorney, Agent, or Firm* — STIP Law Group, LLC (57) ABSTRACT

There is provided a method for measuring a temperature using a thermistor with which it is possible to precisely measure a temperature above a thermoelectric device by using a thermistor disposed on the thermoelectric device in a module for controlling a temperature of a component arranged on the thermoelectric device by using the thermoelectric device. In the method for measuring a temperature using a thermistor, by electrically connecting the thermistor to an electrode pin through a thermoelectric device or a bridge sub-mount mounted on the thermoelectric device when electrically connecting a top surface of the thermistor and the electrode pin, it is possible to suppress direct heat exchange between the thermistor and the electrode pin. Further, it is possible to effectively suppress heat exchange between the thermistor and a package lid by internal gas of a package by covering the thermistor with a polymer material, such as an epoxy having low thermal transmittance. As a result, it is possible to allow the thermistor to precisely measure the temperature of the thermoelectric device.

5 Claims, 5 Drawing Sheets

METHOD FOR MEASURING TEMPERATURE USING A THERMISTOR

CROSS-REFERENCE TO RELATED APPLICATION

This application claims the benefit of Korean Patent Application No. 10-2011-0047213, filed on May 19, 2011 in the Korean Intellectual Property Office, the disclosure of which is incorporated herein by reference.

TECHNICAL FIELD

The present invention relates to a method for measuring a temperature using a thermistor, and more particularly, to a method for measuring a temperature using a thermistor with which it is possible to precisely measure a temperature above a thermoelectric device by using a thermistor disposed on the thermoelectric device in a module for controlling a temperature of a component arranged on the thermoelectric device by using the thermoelectric device.

BACKGROUND ART

A thermoelectric device is a device that adjusts a temperature of a component arranged on the thermoelectric device by current flowing through the thermoelectric device. Such a thermoelectric device can be manufactured in a very small size. Since mechanical properties such as compression or expansion of gas are not changed when the component is cooled and heated, the thermoelectric device is widely adopted to adjust a temperature of a small component. For example, in an optical communication field, a wavelength of a semiconductor laser used for optical communication depends on a temperature of the semiconductor laser.

In recent years, in a DWDM (Dense Wavelength Division Multiplexing) scheme used for optical communication, light having a frequency interval of 100 GHz is used, and such a frequency interval has a wavelength interval of about 0.8 nm at a wavelength band of 1.55 μm. In contrast, in a DFB-LD (Distributed Feedback Laser Diode) used for optical communication, when a temperature of a semiconductor laser diode chip is changed by about 1° C., a laser light beam released from the semiconductor laser is changed by about 0.1 nm. Accordingly, in general, when a temperature of the DFB-LD is changed by about 8° C., a wavelength of light released from the laser corresponds to another channel of the DWDM to cause communication crosstalk. Therefore, in the DWDM, the temperature of the semiconductor laser needs to be very precisely adjusted.

The thermoelectric device has been successfully used to control the temperature of the DFB-LD chip. In order to control a temperature above the thermoelectric device by using the thermoelectric device, it is required that a device called a thermistor is first mounted on the thermoelectric device and a temperature of the thermoelectric device is measured.

Figure 1:
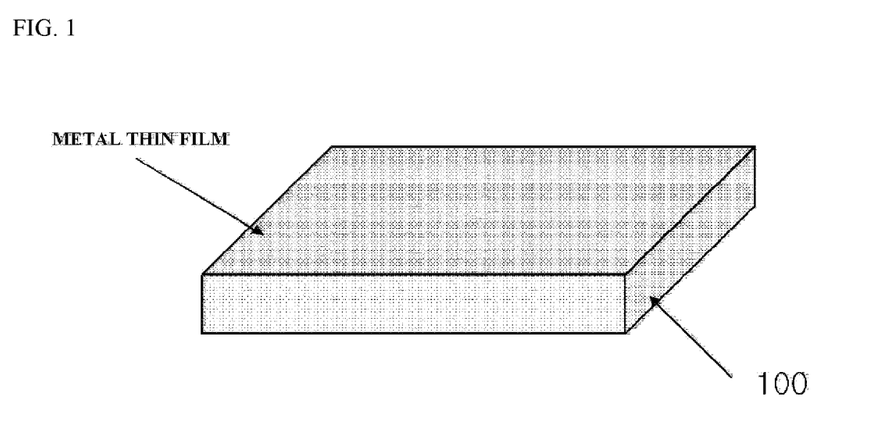
FIG. 1 is a perspective view of a conventional thermistor.

FIG. 1 is a perspective view of a conventional thermistor. A conventional thermistor 100 is a device having characteristics in which a resistance value is varied depending on a temperature, and typically has a rectangular shape whose bottom is wide. A metal thin film is coated on top and bottom surfaces of the thermistor 100 to be able to be electrically connected to an external electrode. The thermistor 100 is a device that measures a temperature of a bottom on which the thermistor is mounted. The thermistor is configured to measure a temperature of the thermistor 100 by connecting the metal thin film deposited on the top and bottom surfaces of the thermistor 100 of FIG. 1 to the external electrode and measuring a resistance of the thermistor 100 which is varied depending on a temperature.

Figure 2:
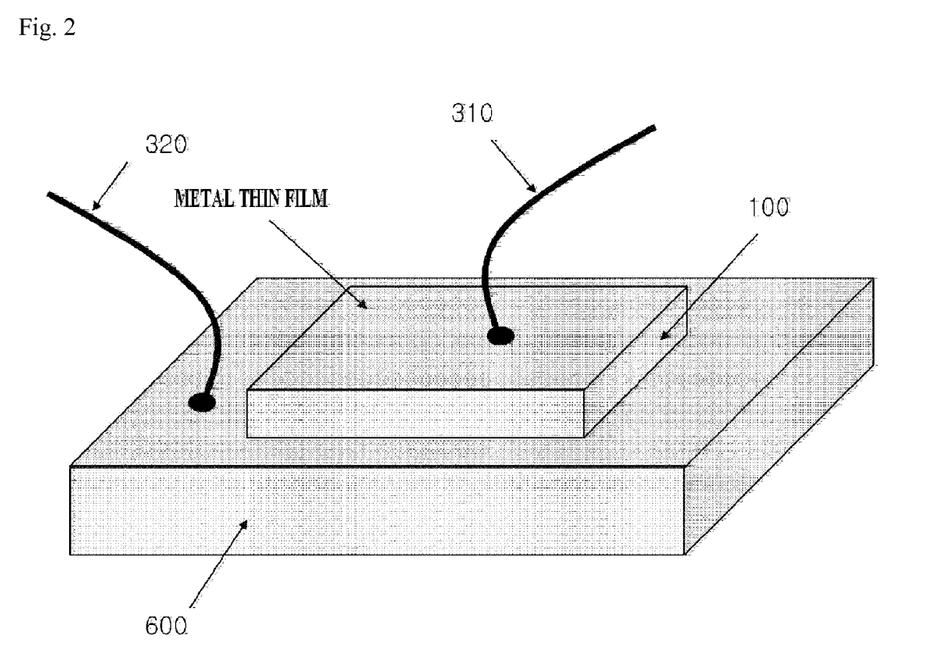
FIG. 2 is a diagram illustrating a state in which a metal electric wire is connected to the conventional thermistor.

FIG. 2 shows a method for connecting the thermistor having the shape shown in FIG. 1 to the external electrode. Since the thermistor 100 having the shape shown in FIG. 1 needs to allow the bottom surface on which the metal thin film is deposited to be attached to a substrate to be measured, the bottom surface of the thermistor 100 having the shape shown in FIG. 1 is attached onto a sub-mount 600 in which metal is deposited on a top surface by using a material having electrical conductivity, and then one metal electric wire 310 is extracted from the top surface of the thermistor 100 to be electrically connected to the external electrode. Further, the other metal electric wire 320 is extracted from the top surface of the sub-mount 600 that is electrically connected to the bottom surface of the thermistor 100 to be electrically connected to the external electrode. By doing this, the resistance of the thermistor 100 is measured. In this way, FIG. 2 illustrates that two electric wires 310 and 320 are extracted from the top surface of the thermistor 100 and the top surface of the sub-mount 600 that is electrically connected to the thermistor 100.

Figure 3:
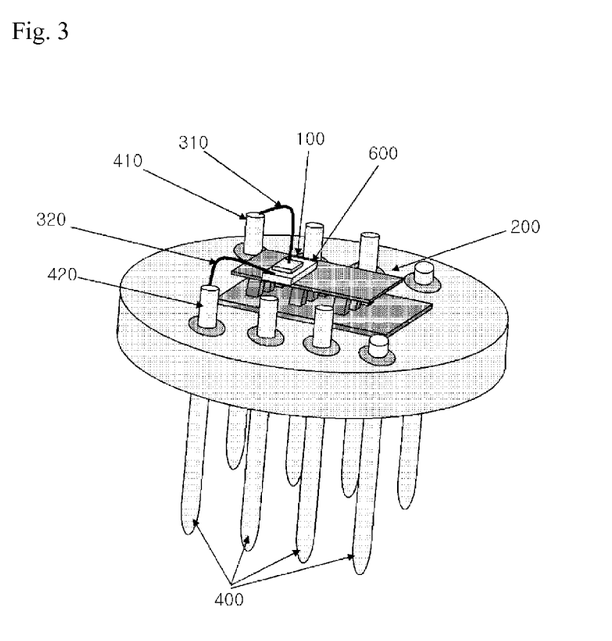
FIG. 3 is an internal configuration diagram of a TO type laser diode package having a conventional thermoelectric device.

FIG. 3 is an internal configuration diagram of a laser diode package and illustrates a state in which the thermistor is attached to a TO (Transistor Outline) type laser diode package including a thermoelectric device in order to measure a temperature of a top surface of the thermoelectric device. In the laser diode package, the thermistor 100 is disposed on a thermoelectric device 200, the top surface of the thermistor 100 is connected to an electrode pin 410 through the metal electric wire 310, and the top surface of the sub-mount 600 onto which the thermistor 100 is attached is connected to an electrode pin 420 through the metal electric wire 320. By doing this, a lower electrode of the thermistor 100 is connected to the external electrode. Reference numeral 400 denotes the electrode pins protruding downward through the laser diode package.

In the shape shown in FIG. 3, temperatures of the electrode pins 410 and 420 of the laser diode package are not adjusted, and only a temperature of the top surface of the thermoelectric device 200 is adjusted by a direction and magnitude of current flowing in the thermoelectric device 200. Accordingly, when an external temperature of the laser diode package is changed, the temperatures of the electrode pins 410 and 420 of the laser diode package are changed depending on the external temperature.

Figure 4:
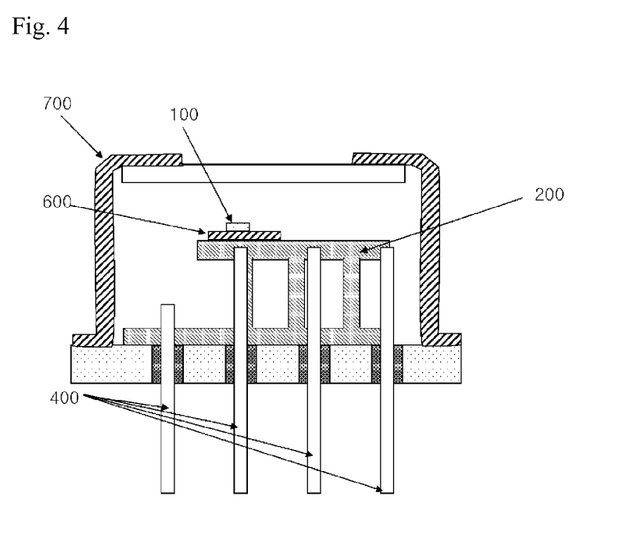
FIG. 4 is a cross-sectional view illustrating a state in which the TO type laser diode package having the conventional thermoelectric device is covered by a package lid.

FIG. 4 is a cross-sectional view showing a state in which the laser diode package of FIG. 3 is covered by a package lid to complete the package. In FIG. 4, in order to accurately control the temperature of the top surface of the thermoelectric device 200 by using the thermistor 100 and the thermoelectric device 200, the thermistor 100 needs to accurately measure the temperature of the top surface of the thermoelectric device 200. However, as shown in FIG. 3, the thermistor 100 is directly connected to the electrode pin 410 having a temperature which is approximate to an external environment temperature and is different from the temperature of the top surface of the thermoelectric device 200 through the metal electric wire 310, so that an error occurs in measuring the temperature of the top surface of the thermoelectric device 200 by the thermistor 100. Such a phenomenon causes a severe error when the thermistor 100 has a very small size and a length of the metal electric wire 310 between the electrode pin 410 and the thermistor 100 is short. Further, since a temperature of a package lid 700 of FIG. 4 is also the same as the external environment temperature, an error is caused in measuring the temperature of the thermistor 100 due to thermal convection and thermal radiation from the package lid 700.

As shown in FIGS. 3 and 4, when the conventional TO type laser diode package is manufactured such that the top surface of the thermistor 100 is directly connected to the electrode pin 410 and the thermistor 100 is exposed to internal gas of the package, a measurement error of about 0.04° C. is caused in the thermistor 100 when the external environment temperature is changed by 1° C. Such a measurement error means that the temperature of the top surface of the internal thermoelectric device 200 is changed by about 5° C. when the external environment temperature is changed by about 125° C., and the measurement error of such a degree becomes a factor by which it is difficult to precisely adjust a wavelength of a laser diode to an extent capable of being applied to a DWDM.

DISCLOSURE

Technical Problem

In order to solve the conventional problems, an object of the present invention is to provide a method for measuring a temperature using a thermistor with which it is possible to accurately measure a temperature by preventing a measurement error of a thermistor caused by thermal transfer of a metal electric wire connecting an electrode pin and the thermistor and allowing the thermistor to accurately measure a temperature of a top surface of a thermoelectric device by thermal convection and thermal radiation of gas within a package when a temperature above the thermoelectric device is measured using a themistor.

Technical Solution

In order to achieve the object, according to an exemplary embodiment of the present invention, there is provided a method for measuring a temperature using a thermistor in which a temperature above a thermoelectric device is measured by electrically connecting top and bottom surfaces of a thermistor disposed on the thermoelectric device to an electrode pin and then measuring a resistance value that is varied with a temperature change of the thermistor through the electrode pin. The method includes electrically connecting the top surface of the thermistor to the electrode pin through a bridge metal pattern formed on the thermoelectric device; and measuring a temperature depending on a change of the resistance value of the thermistor.

The bridge metal pattern may be formed by depositing a metal thin film on the thermoelectric device or a bridge sub-mount mounted on the thermoelectric device.

The bottom surface of the thermistor may be mounted on the metal pattern formed on the thermoelectric device or a sub-mount mounted on the thermoelectric device, and the metal pattern to which the bottom surface of the thermistor may be mounted thereon may be electrically connected to an electrode pin through a metal electric wire.

Meanwhile, according to another exemplary embodiment of the present invention, there is provided a method for measuring a temperature using a in which a temperature above a thermoelectric device is measured by electrically connecting top surface of a thermistor disposed on the thermoelectric device to an electrode pin and then measuring a resistance value that is varied with a temperature change of the thermistor through the electrode pin. The method includes measuring a temperature depending on a change of the resistance value of the thermistor by covering the thermistor disposed on the thermoelectric device with a polymer material having electrical insulating characteristics in order to prevent heat exchange with an atmosphere.

The polymer material may include any one of an epoxy material, a rubber material, and a vinyl material.

Effect of the Invention

According to exemplary embodiments of the present invention, there is an effect in that a measurement error in measuring a temperature of the thermistor is reduced to an extent of 0.012° C. with a method in which a change of 1° C. in an external temperature when an electrode on a top surface of a thermistor is electrically connected to a metal pattern deposited on a thermoelectric device or a metal pattern disposed on the thermoelectric device and the metal pattern is electrically connected to an electrode pin is used. Further, when a method in which the thermistor is covered with insulating epoxy is used together with the aforementioned method, there is another effect in that the measurement error in measuring the temperature of the thermistor is reduced to an extent of 0.003° C. with a change of 1° C. in an external temperature. Accordingly, when the temperature above the thermoelectric device is measured using the thermistor according to the present invention, it is possible to greatly enhance the measurement error in measuring the temperature of the top surface of the thermoelectric device with a change in the external environment temperature.

BEST MODE

Hereinafter, preferred embodiments of the present invention will be described in detail with reference to the accompanying drawings. For ease of understanding of explanation, in the embodiments of the present invention, a laser diode package in which a temperature above a thermoelectric device is measured using a thermistor will be described as an example. However, the present invention is applicable to various packages required to measure the temperature above the thermoelectric device by using the thermistor and it is obvious that such an application is not limited to the laser diode package.

Before the detailed description of the present invention, a method for measuring a temperature above a thermoelectric device by using the conventional thermistor, which is compared with the present invention, is first explained.

Figure 5:
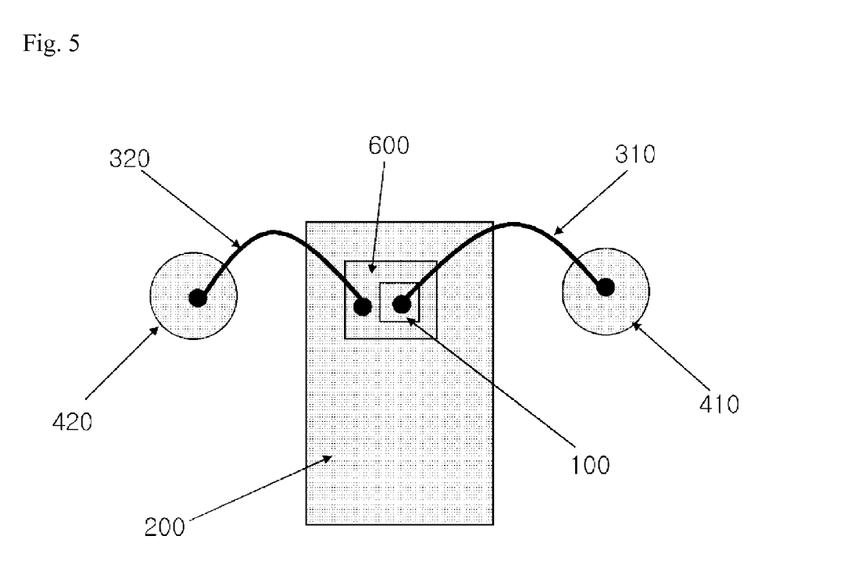
FIG. 5 is a state diagram showing a method for connecting an electrode pin and the conventional thermistor.

FIG. 5 is a diagram illustrating a connection method of a metal electric wire in measuring a temperature of a thermoelectric device by using the conventional thermistor.

As shown in FIG. 5, an electrode coated on a top of a thermistor 100 is directly connected to an electrode pin 410 by using a metal electric wire 310 such as Au, Al, or Cu. Further, a lower electrode of the thermistor 100 is connected with a metal pattern (thin film) of a sub-mount 600 that is electrically connected to a bottom surface of the thermistor 100 by using a conductive adhesive, and the metal pattern of the sub-mount 600 is connected to another electrode pin 420 through a metal electric wire 320, so that electrical connection of the upper electrode of the thermistor 100 is completed. Meanwhile, the sub-mount 600 is mounted on a top of a thermoelectric device 200.

The metal electric wires 310 and 320 made from a material such as Au, Al or Cu have good electrical conductivity and a good thermal conductivity of 300 W/K/m or more. Accordingly, when there is a difference between temperatures of the electrode pins 410 and 420 which are determined depending on an external environment temperature of a package and a temperature of a top plate of the thermoelectric device 200, a temperature difference is generated between the thermistor 100 that is thermally in contact with the thermoelectric device 200 and the electrode pins 410 and 420, and such a temperature difference causes heat exchange between the electrode pins 410 and 420 and the thermistor 100. Typically, the thermistor 100 is a device having a subminiature size of 0.5 mm×0.5 mm×0.2 mm. Thermal energy exchanged between such a subminiature-sized device and the electrode pin 410 through the metal electric wire 310 having high thermal conductivity disturbs the temperature of the thermistor 100, and thus the thermistor 100 does not accurately measure the temperature above the thermoelectric device 200. Especially, such a phenomenon greatly influences a smaller thermistor 100.

Meanwhile, a problem is caused by heat exchange through the metal electric wire 320 connecting a bottom plate of the thermistor 100 and the electrode pin 420, and since the heat transferred through the metal electric wire 320 is easily dissipated by a substrate having a relatively very large size, the influence on the thermistor 100 is limited. However, since thermal energy transferred through the metal electric wire 310 that is connected to the top of the thermistor 100 intensively influences the thermistor 100, the quantity of heat through the metal electric wire 310 that is connected to the top of the thermistor 100 is significant.

The laser diode package used currently for optical communication has been developed from an existing non-cooling type to a cooling type so as to be able to precisely control a wavelength of a laser, and the cooling type laser diode package has been developed from a butterfly type package having a volume of several cc to a TO type package having a volume of 1 cc or less. Along with a decrease in size of the cooling type package, a size of the thermistor is gradually decreased and a distance between the thermistor and the electrode pin is gradually short, so that the measurement error of the thermistor by heat exchange when the thermistor and the electrode pin are connected through the metal electric wire reaches a level that cannot be ignored.

Since the quantity of heat transferred to the metal electric wire from the electrode pin directly influences the small thermistor, the metal electric wire for directly connecting the thermistor and the electrode pin is a portion where the top surface of the thermistor and the electrode pin are connected.

In order to solve the problem, in the present invention, by electrically connecting the top surface of the thermistor to the electrode pin through a bridge metal pattern formed on the thermoelectric device, it is possible to minimize influence caused by heat transfer generated by the metal electric wire. In embodiments of the present invention, a bridge metal pattern formed on the thermoelectric device in order to connect the top surface of the thermistor and the electrode pin is formed by depositing a metal thin film on a top of the bridge sub-mount mounted on the thermoelectric device or by directly depositing a metal thin film on the thermoelectric device.

Hereinafter, a structure for connecting an electrode pin and a thermistor according to the present invention will be described in detail.

Figure 6:
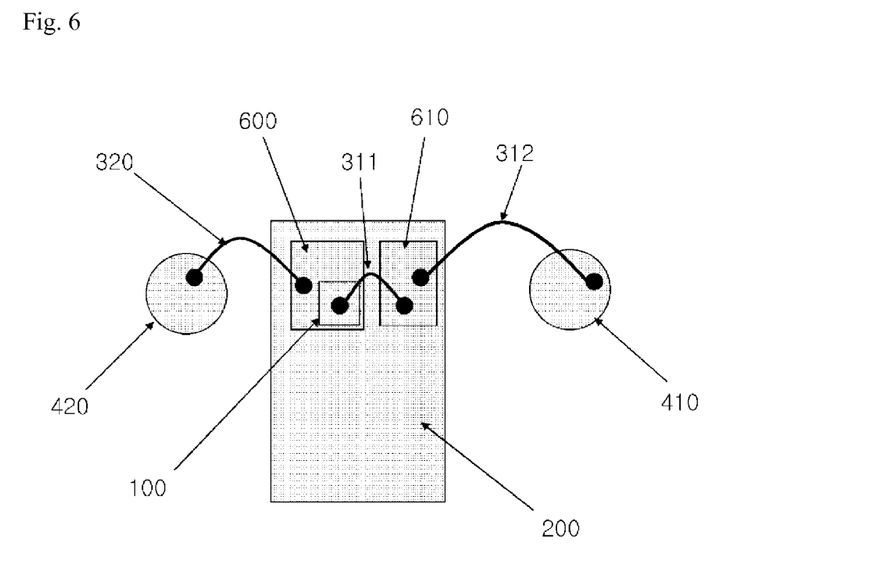
FIG. 6 shows an example of a method for connecting an electrode pin and a thermistor according to the present invention.

FIG. 6 shows an example of a method for connecting an electrode pin and a thermistor according to an embodiment of the present invention. Unlike the conventional method of directly connecting the top of the thermistor 100 and the electrode pin 410 through the metal electric wire, FIG. 6 shows a method in which a metal electric wire is indirectly connected to a top of a thermistor and an electrode pin by using a bridge sub-mount 610 for electric connection that is disposed on a thermoelectric device 200. That is, a top surface of the thermistor 100 is connected to a top surface of the bridge sub-mount 610 mounted on one side of a top of the thermoelectric device 200 through a metal electric wire 311, the top surface of the bridge sub-mount 610 is connected to an electrode pin 410 through another metal electric wire 312, and then the top surface of the thermistor 100 is electrically connected to the electrode pin 410 through the bridge sub-mount 610. To achieve this, it is preferred to form a metal pattern on the top surface of the bridge sub-mount 610 disposed on the thermoelectric device 200 by depositing a metal thin film on the bridge sub-mount.

Since a temperature of the bridge sub-mount 610 is adjusted by the thermoelectric device 200 while the bridge sub-mount is mounted on the thermoelectric device 200, the metal electric wire 311 connecting the top surface of the thermistor 100 and the bridge sub-mount 610 is not affected by an external environment temperature. Since there is a temperature difference between the bridge sub-mount 610 and the electrode pin 410 affected by the external environment temperature, heat exchange through the metal electric wire 312 is caused, but the exchanged heat is dissipated from the entire bridge sub-mount 610 and the top surface of the thermoelectric device 200 on which the bridge sub-mount 610 is mounted and only a part of the exchanged heat is transferred to the thermistor 100 through the metal electric wire 311 connecting the thermistor 100 and the substrate, the influence of the temperature difference between the electrode pin 410 and the top surface of the thermoelectric device 200 on the thermistor 100 can be minimized.

Meanwhile, in FIG. 6, a structure in which a bottom surface of the thermistor 100 is connected to the another electrode pin 420 through the metal electric wire 320 and the sub-mount 600 mounted on the top of the thermoelectric device 200 is the same as the conventional structure shown in FIG. 5.

As shown in FIG. 6, the method for electrically connecting the top surface of the thermistor 100 and the electrode pin 410 through the bridge sub-mount 610 disposed on the thermoelectric device 200 without directly connecting the top surface of the thermistor and the electrode pin may be implemented in various manners.

Figure 7:
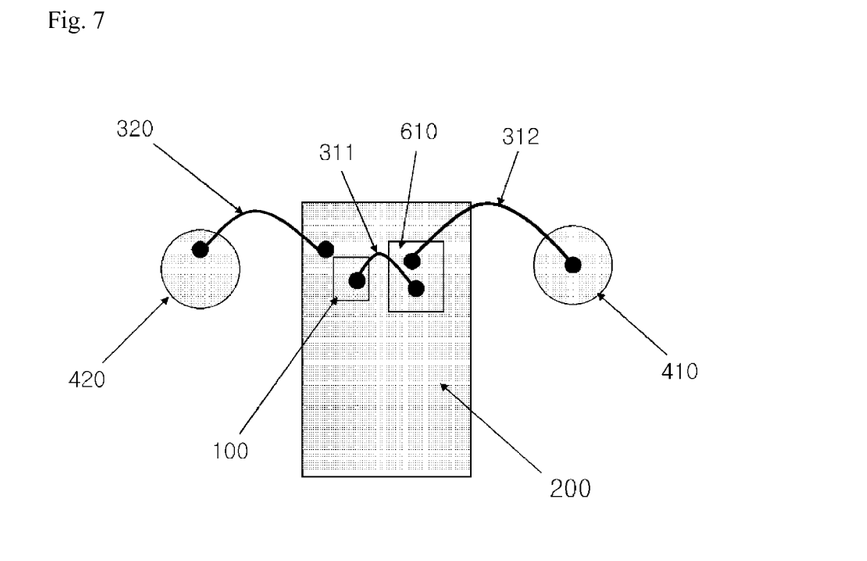
FIG. 7 shows another example of a method for connecting an electrode pin and a thermistor according to the present invention.

FIG. 7 shows an example of a method for connecting an electrode pin and a thermistor according to another embodiment of the present invention.

As shown in FIG. 7, in the another embodiment of the present invention, after a metal thin film is coated on the top surface of the thermoelectric device 200, the thermistor 100 is directly attached onto the top surface of the thermoelectric device 200 on which the metal thin film is coated by using conductive solder, and the bridge sub-mount 610 is mounted on one side of the top surface of the thermoelectric device 200. Thereafter, the metal electric wire 320 is connected to the electrode pin 420 and the top surface of the thermoelectric device 200 on which the metal thin film is coated, so that the bottom surface of the thermistor 100 is electrically connected to the electrode pin 420 through the metal electric wire 320 and the top surface of the thermoelectric device 200. Moreover, the top surface of the thermistor 100 and the top surface of the bridge sub-mount 610 are connected through the metal electric wire 311, and the electrode pin 410 and the top surface of the bridge sub-mount 610 are connected through the another metal electric wire 312, so that the top surface of the thermistor 100 is electrically connected to the electrode pin 410 through the bridge sub-mount 610.

Meanwhile, since the metal electric wires 311 and 312 (320) electrically connecting the top and bottom surfaces of the thermistor 100 to the electrode pins 410 and 420 are electrically insulated from each other, a medium object such as the bridge sub-mount 610 need not be necessarily mounted on the thermoelectric device 200 in order to electrically connect the top surface of the thermistor 100 and the electrode pin 410.

Figure 8:
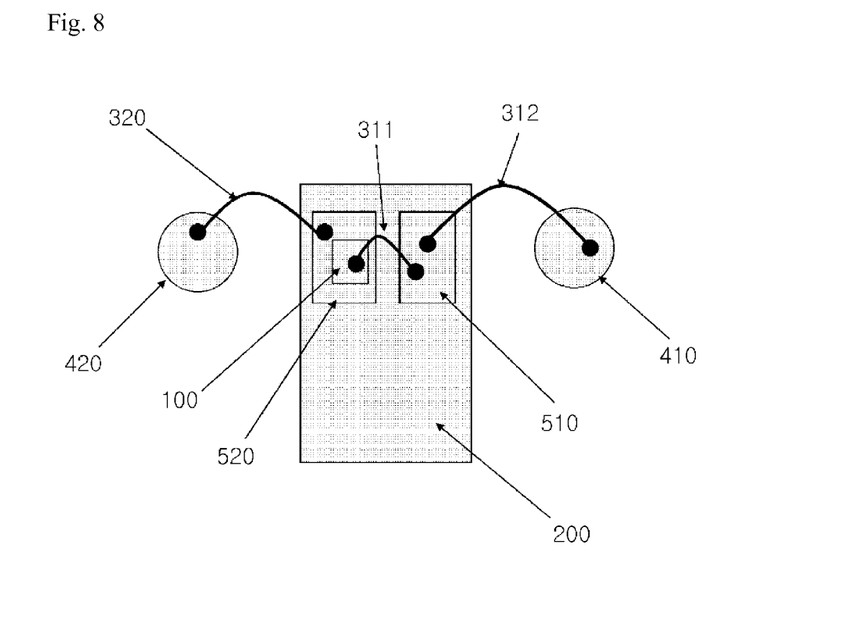
FIG. 8 illustrates still another example of a method for connecting an electrode pin and a thermistor according to the present invention.

FIG. 8 illustrates an example of a method for connecting an electrode pin and a thermistor according to still another embodiment of the present invention.

As illustrated in FIG. 8, metal thin film regions 510 and 520 are formed by depositing a plurality of metal thin films that is electrically insulated from each other on the top surface of the thermoelectric device 200, the thermistor 100 is attached to one metal thin film region 520, and then the metal thin film region 520 to which the thermistor 100 is attached is connected to the electrode pin 420 through the metal electric wire 320. By doing this, the bottom surface of the thermistor 100 is electrically connected to the electrode pin 420 through the metal electric wire 320 and the metal thin film region 520 formed on the thermoelectric device 200.

In addition, the top surface of the thermistor 100 and the other metal thin film region 510 deposited on the thermoelectric device 200 are connected through the metal electric wire 311, and the metal thin film region 510 and the electrode pin 410 are connected through the another metal electric wire 312, so that the top surface of the thermistor 100 is electrically connected to the electrode pin 410 through the metal thin film region 510 deposited on the thermoelectric device 200. In such a method, in order to electrically connect the top surface of the thermistor 100 and the electrode pin 410, only the thermoelectric device 200 is used without using a separate object such as the bridge sub-mount.

As shown in FIGS. 6 to 8, when the top surface of the thermistor 100 and the electrode pin 410 are electrically connected through the metal thin film deposited on the thermoelectric device 200 or the bridge sub-mount 610 that is thermally in contact with the top of the thermoelectric device 200 without directly connecting the top surface of the thermistor and the electrode pin through the metal electric wire, any problem is not caused in the electric connection of the thermistor 100, and it is possible to minimize a disturbance of the temperature measurement of the thermistor 100 due to the heat exchange through the metal electric wire 312 caused by the temperature difference between the electrode pin 410 and the top surface of the thermoelectric device 200.

By using such a method, it is possible to reduce an error of 0.04° C., which is a temperature measurement error of the internal thermistor 100 with a change of 1° C. in the conventional external temperature, to an error of 0.012° C. or less.

Meanwhile, the TO type package is sealed by gas such as air or nitrogen, and the thermistor exchanges heat with the package lid of the TO type package through the internal gas of the package. The thermistor exchanges heat with the external environment through an outer surface of the thermistor coming in contact with the internal gas of the package, and the heat exchange allows the thermistor not to precisely measure the temperature of the top plate of the thermoelectric device. Such heat exchange can be enhanced by covering the thermistor with a material having low thermal conductivity and electrical insulating characteristics. A polymer material such as epoxy, rubber, plastic, or vinyl is appropriately used as the material having such characteristics. The polymer material having a thickness of 30 μm or more is appropriately used, and the polymer material such as epoxy, rubber, or vinyl has a low thermal conductivity of about 10 W/m/K.

Figure 9:
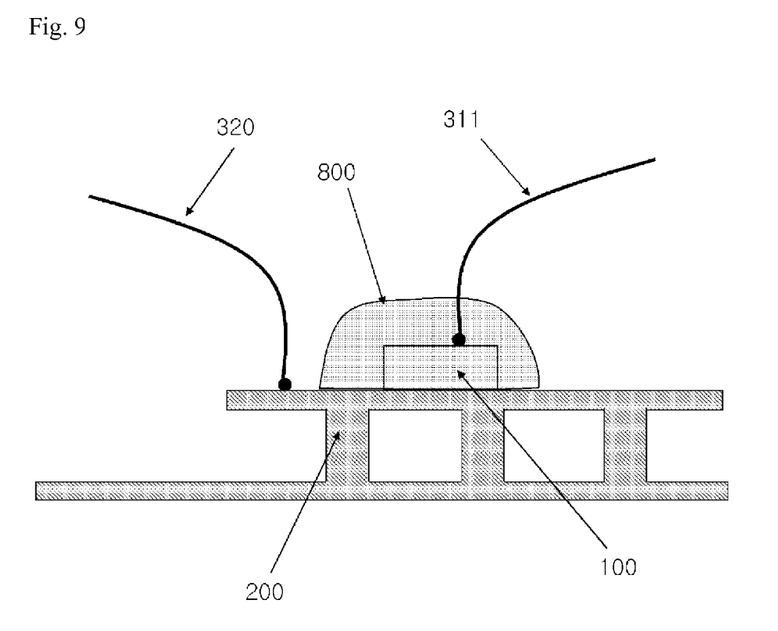
FIG. 9 shows an example of a method for covering a thermistor with epoxy according to the present invention.

FIG. 9 is a cross-sectional view showing an example of covering the thermistor according to the embodiment of the present invention with a polymer material having electrical insulating characteristics.

As shown in FIGS. 6 to 8, the top surface of the thermistor 100 is electrically connected to the electrode pin 410 through the metal pattern deposited on the top surface of the thermoelectric device 200 or the bridge sub-mount 610 mounted on the top surface of the thermoelectric device 200 without directly connecting and the top surface of the thermistor and the electrode pin 410, and when the heat exchange of the thermistor 100 with the internal gas of the package is blocked by being covered with a polymer material 800 such as epoxy having low thermal conductivity as shown in FIG. 9, it is possible to control the temperature measurement error of the thermistor 100 to 0.004° C. or less with a change of 1° C. in the external temperature.

Effects exhibited when the control of allowing the temperature measurement error to fall in such a degree is applied to the laser diode package for optical communication are follows as. The typical laser package for optical communication needs to be used in a range of −40 to 85° C. At this time, when the thermistor is electrically connected to the electrode pin by the conventional method, the temperature measurement error of about 0.04° C. occurs in the thermistor with a change of 1° C. in the external temperature, and the temperature measurement error of about 0.04° C. causes a temperature measurement error of about 5° C. in a use temperature range of the laser diode of 125° C. Typically, since a wavelength of about 100 pm is changed in the semiconductor laser with a change of 1° C. in temperature, a change of 125° C. in the external environment temperature causes a laser release wavelength change of about 500 pm. In the current DWDM (Dense Wavelength Division Multiplexing) communication scheme, a wavelength of a laser is allowed to be changed by 200 pm with a change of 125° C.

in the external environment temperature. Accordingly, wavelength accuracy required in the current DWDM is not satisfied by the conventional method. In contrast, when the method in which the thermistor is not directly connected to the electrode pin and the method in which the thermistor is covered with a polymer material such as epoxy are used, the temperature measurement error of the thermistor with a change of 1° C. in the external temperature is 0.004° C. and such an temperature measurement error changes a laser wavelength of 50 pm with a change of 125° C. in the external environment temperature, thereby applying to the DWDM scheme.

In this way, according to the present invention, by electrically connecting the top surface of the thermistor to the electrode pin through the metal thin film formed on the thermoelectric device or the metal thin film formed on the bridge sub-mount mounted on the thermoelectric device, it is possible to minimize the temperature measurement error caused by the heat transfer of the metal electric wire connecting the electrode pin and the thermoelectric device. Furthermore, by covering the outer surface of the thermistor with the insulating polymer material and minimizing the influence by a change in the ambient atmosphere temperature, it is possible to minimize the temperature measurement error.

The present invention is not limited to the above-mentioned embodiments. It will be appreciated by those of ordinary skill in the art that the present invention can be embodied in various forms and embrace various modifications without departing from the technical spirit of the present invention, the scope of the claims, and the equivalence thereof.

The invention claimed is:

1. A method for measuring a temperature using a thermistor in which a temperature above a thermoelectric device is measured by electrically connecting top and bottom surfaces of a thermistor disposed on the thermoelectric device to an electrode pin and then measuring a resistance value that is varied with a temperature change of the thermistor through the electrode pin, the method comprising:

electrically connecting the top surface of the thermistor (100) to a first electrode pin (410) through a bridge metal pattern formed on the thermoelectric device (200) and electrically connected to the thermoelectric device (200);

measuring a temperature depending on a change of the resistance value of the thermistor;

wherein the bottom surface of the thermistor (100) is mounted on the metal pattern formed on the thermoelectric device (200) or on a sub-mount (600) mounted on the thermoelectric device (200), and the metal pattern to which the bottom surface of the thermistor (100) is mounted thereon is electrically connected to a second electrode pin (420) through a metal electric wire (320); and wherein measuring a temperature depending on a change of the resistance value of the thermistor by covering the thermistor (100) disposed on the thermoelectric device (200) with a polymer material (800) having electrical insulating characteristics in order to prevent heat exchange with an atmosphere.

2. The method for measuring temperature using the thermistor according to claim 1, wherein the bridge metal pattern is formed by depositing a metal thin film on the thermoelectric device (200) or bridge sub-mount (610) mounted on the thermoelectric device (200).

3. The method for measuring temperature using the thermistor according to claim 1, wherein the polymer material (800) includes any one of an epoxy material, a rubber material, and a vinyl material.

4. A method for measuring a temperature using a thermistor in which a temperature above a thermoelectric device is measured by electrically connecting top and bottom surfaces of a thermistor disposed on the thermoelectric device to an electrode pin and then measuring a resistance value that is varied with a temperature change of the thermistor through the electrode pin, the method comprising:

electrically connecting the top surface of the thermistor (100) to a first electrode pin (410) through a bridge metal pattern formed on the thermoelectric device (200) and electrically connected to the thermoelectric device (200);

measuring a temperature depending on a change of the resistance value of the thermistor;

wherein the bottom surface of the thermistor (100) is mounted on the metal pattern formed on the thermoelectric device (200) or on a sub-mount (600) mounted on the thermoelectric device (200), and the metal pattern to which the bottom surface of the thermistor (100) is mounted thereon is electrically connected to a second electrode pin (420) through a metal electric wire (320); and wherein the top surface of the thermistor (100) is electrically connected to the first electrode pin (410) through a top surface of a second bridge sub-mount (610) mounted on one side of a top of the thermoelectric device (200) through a metal wire (312).

5. The method for measuring temperature using the thermistor according to claim 4, wherein measuring a temperature depending on a change of the resistance value of the thermistor by covering the thermistor (100) disposed on the thermoelectric device (200) with a polymer material (800) having electrical insulating characteristics in order to prevent heat exchange with an atmosphere.

* * * * *